United States Patent
Wada

[19]

[11] Patent Number: 6,026,048
[45] Date of Patent: *Feb. 15, 2000

[54] SYNCHRONOUS RANDOM ACCESS MEMORY

[75] Inventor: Tomohisa Wada, Hyogo, Japan

[73] Assignee: Mitsubishi Denki Kabushiki Kaisha, Tokyo, Japan

[*] Notice: This patent issued on a continued prosecution application filed under 37 CFR 1.53(d), and is subject to the twenty year patent term provisions of 35 U.S.C. 154(a)(2).

[21] Appl. No.: 09/005,688

[22] Filed: Jan. 13, 1998

Related U.S. Application Data

[63] Continuation of application No. 08/846,206, Apr. 28, 1997, Pat. No. 5,752,270, which is a continuation of application No. 08/605,565, Feb. 22, 1996, abandoned, which is a division of application No. 08/354,767, Dec. 12, 1994, Pat. No. 5,515,325.

[30]     Foreign Application Priority Data

Dec. 24, 1993  [JP]  Japan .................................. 5-326919

[51] Int. Cl.$^7$ .................................................. G11C 13/00
[52] U.S. Cl. .............................. 365/230.08; 365/189.05
[58] Field of Search .......................... 365/189.1, 189.05, 365/230.01, 230.08

[56]           References Cited

U.S. PATENT DOCUMENTS

| | | |
|---|---|---|
| 3,810,110 | 5/1974 | Kotok et al. . |
| 4,509,142 | 4/1985 | Childers . |
| 4,712,190 | 12/1987 | Guglielmi et al. . |
| 4,760,546 | 7/1988 | Ishida et al. . |
| 4,882,709 | 11/1989 | Wyland . |
| 5,124,589 | 6/1992 | Shiomi et al. . |
| 5,311,483 | 5/1994 | Takasugi . |
| 5,363,330 | 11/1994 | Kobayashi . |
| 5,377,341 | 12/1994 | Kaneko et al. . |
| 5,404,486 | 4/1995 | Frank et al. . |
| 5,440,717 | 8/1995 | Bosshart . |

FOREIGN PATENT DOCUMENTS

| | | |
|---|---|---|
| 62-250583 | 10/1987 | Japan . |
| 1-58591 | 12/1989 | Japan . |
| 2-83895 | 3/1990 | Japan . |
| 2-137189 | 5/1990 | Japan . |
| 3-34190 | 2/1991 | Japan . |
| 3-58386 | 3/1991 | Japan . |
| 3-76094 | 4/1991 | Japan . |
| 4-184791 | 7/1992 | Japan . |
| 5-144269 | 6/1993 | Japan . |

OTHER PUBLICATIONS

IBM Prepares Synch SRAM Entries, Electric News, Jun. 6, 1994, p. 70.

Child, "RISC and Pentium drive demand for SRAMs that are fastest of the fast, " COMPUTER DESIGN, Mar. 28, 1994, pp. 47–48.

*Primary Examiner*—Terrell W. Fears
*Attorney, Agent, or Firm*—McDermott, Will Emery

[57]           ABSTRACT

An internal address signal corresponding to data to be written into a memory cell is held in a latch circuit. The held internal address signal is selected by a multiplexer in the next writing operation and applied to a decoder. Write data is taken in and held by the latch circuit during the period in which data is not being read out from the memory cell array. A comparator compares the held internal address signal and an internal address signal for reading data. If a matching is found between them, the multiplexer outputs data from the latch circuit for external output. Accordingly, delay of a writing operation following a reading operation can be eliminated without increasing chip cost, package cost, and system cost, as a result high speed operation of cache memories is achieved and the speed performance of computers of various levels such as supercomputers, large size calculators, work stations and personal computers can be improved.

10 Claims, 13 Drawing Sheets

SYNCHRONOUS RANDOM ACCESS MEMORY

This application is a Rule 53(b) Continuation of application Ser. No. 08/846,206 filed Apr. 28, 1997, now U.S. Pat. No. 5,752,270 which is a Rule 62 Continuation of application Ser. No. 08/605,565, filed on Feb. 22, 1996, abandoned which is a Rule 60 Divisional of application Ser. No. 08/354,767, filed on Dec. 12, 1994, now U.S. Pat. No. 5,515,325.

BACKGROUND OF THE INVENTION

1. Field of the Invention

The present invention relates generally to synchronous random access memories (hereinafter referred to as synchronous RAMs), and more specifically, to a high speed synchronous RAM used for improving the speed performance of a computer.

2. Description of the Background Art

A synchronous RAM is a memory which operates in synchronization with an externally applied signal. A typical example of such a synchronous RAM is a synchronous static random access memory (hereinafter referred to as synchronous SRAM).

Synchronous SRAMs are used for cache memories provided for improving speed performance in computers of various levels such as supercomputer, large size calculator, work station, and personal computer.

Conventional synchronous SRAMs as such are disclosed in Japanese Patent Laying-Open No. 2-137189, Japanese Patent Publication No. 1-58591, and Japanese Patent Laying-Open No. 62-250583.

Japanese Patent Laying-Open No. 2-137189 discloses that a plurality of circuits in a memory are formed into a latch and controlled with a clock, in order to reduce cycle time. Japanese Patent Publication No. 1-58591 discloses that an input latch circuit for address signals and a circuit for latching outputs from a decode circuit are operated in a complementary manner with a single clock signal. Japanese Patent Laying-Open No. 62-250583 discloses producing of an internal write enable signal in response to an externally applied clock signal.

Now, a conventional general synchronous SRAM will be described. FIG. 9 is a block diagram showing an example of a conventional synchronous SRAM.

Referring to FIG. 9, the synchronous SRAM includes a memory core 50, latch circuits 11, 12, 16~19, 25, and 26, buffer circuits 63, 67, and 68, inverter circuits 64 and 69, and a tri-state buffer circuit 68.

Memory core 50 includes a memory cell array 51, a decoder 52, a read circuit 53 and a write circuit 54. Decoder 52, read circuit 53, and write circuit 54 are connected to memory cell array 51.

An externally applied address signal ADD is input from an address input pin 1, and applied to decoder 52 as an internal address signal RADD through buffer circuit 61, and latch circuits 11 and 16. An externally applied write enable signal NWE input from a control input pin 2 is applied to read circuit 53 and write circuit 54 as an internal write enable signal NWEin through buffer circuit 62, and latch circuits 12 and 17.

Read data RD output from read circuit 53 is applied to a data input/output pin 4 through latch circuits 18, 19 and tri-state buffer circuit 68 and externally output therefrom. Thus, tri-state buffer 68 acts as an output buffer circuit. Externally applied write data is input from input/output pin 4 and is applied to write circuit 54 as write data WD through buffer circuit 67, and latch circuits 26 and 25.

An externally applied clock signal K is input from a clock input pin 5. Buffer circuit 63 outputs an internal clock signal PH1 in response to external clock signal K. Inverter 64 outputs an internal clock signal PH2 which is the inverse of internal clock signal PH1 in response to external clock signal K.

Latch circuits 16, 17, 19 and 25 operate in response to internal clock signal PH1. Latch circuits 11, 12, 18, and 26 operate in response to internal clock signal PH2. These latch circuits each propagate input data to each output if an applied internal clock signal is in H level, and latch data for output if the applied internal clock signal is in L level.

In FIG. 9, the latch circuits which receive internal clock signal PH1 are denoted by "PH1", and the latch circuits which receive internal clock signal PH2 are denoted at "PH2" for ease of illustration.

An external output enable signal NOE input from a control input pin 3 is inverted at inverter 69 and applied to tri-state buffer circuit 68 as a control signal. The three states of tri-state buffer circuit 68 are controlled in response to the control signal. More specifically, tri-state buffer 68 is activated if external enable signal NOE is in L level, and attains a high impedance state if external output enable signal NOE is in H level.

Other conventional synchronous SRAMs will be described. FIG. 10 is a block diagram showing the structure of another conventional synchronous SRAM.

Referring to FIG. 10, unlike the synchronous SRAM shown in FIG. 9, the synchronous SRAM is not provided with latch circuit 26 as shown in FIG. 9. Therefore, the synchronous SRAM shown in FIG. 10 which operates basically the same as the synchronous SRAM in FIG. 9 has a slightly different timing spec. for the absence of latch circuit 26.

The synchronous SRAMs shown in FIGS. 9 and 10 each do not have any latch circuit which operates in response to internal clock signal PH1 or PH2 in the path until input of external output enable signal NOE into tri-state buffer circuit 68. Tri-state buffer circuit 68 operates asynchronously with respect to external clock signal K.

Besides, a latch circuit may be provided in the path until input of external output enable signal NOE into tri-state buffer 68. Such a synchronous SRAM has a slightly different timing spec. from the synchronous SRAMs in FIGS. 9 and 10.

Operations of the conventional synchronous SRAMs shown in FIGS. 9 and 10 will be described. As described above, the synchronous SRAMs shown in FIGS. 9 and 10 operate basically in the same manner, and therefore the synchronous SRAM shown in FIG. 10 will be described by way of illustration.

FIG. 11 is a timing chart for use in illustration of the synchronous SRAM shown in FIG. 10. Illustrated in FIG. 11 are external clock signal K, external write enable signal NWE, external address signal ADD, data input/output signal DQ and external output enable signal NOE.

Herein, the period in which external clock signal K attains H level is called first phase Ph1, and the period in which external clock signal K attains L level is called second phase Ph2. First phase Ph1 corresponds to the period in which internal clock signal PH1 attains H level, and second phase Ph2 corresponds to the period in which internal clock signal PH2 attains H level.

First phase Ph1 and second phase Ph2 as such constitute one cycle for operation of the synchronous SRAM.

In FIG. 11, a first cycle CY1 to a seventh cycle CY7 are shown. In the series of cycles, writing, reading, writing, reading and reading operations are sequentially executed. The writing operations herein include not only writing of data into memory cell array 51 but also operations related to input of external address signal ADD and write data for the data writing.

The reading operations herein include not only data reading from memory cell array 51 but also operations related to input of an external address signal for the data reading and external output of the read data.

For the above writing operations, cycles for writing of data into memory cell array 51 are denoted by "WRITE" in the figure, and for the above reading operations, cycles for data reading from memory cell array 51 are denoted by "READ". Data input/output to/from data input/output pin 4 is illustrated at DQ.

In operation, it is assumed that external address signal ADD passes through latch circuit 11 and external write enable signal NWE passes through latch circuit 12 in the second phase of a cycle immediately before first cycle CY1.

Then in the first phase Ph1 of first cycle CY1, internal clock signal PH2 attains L level. Thus, external address signal ADD and external write enable signal NWE are latched by latch circuits 11 and 12, respectively.

In first phase Ph1, internal clock signal PH1 attains H level. Thus, the latched external address signal ADD is applied to decoder 52 as internal address signal RADD through latch circuit 16. At the time, the latched external write enable signal NWE is applied as internal write enable signal NWEin to read circuits 53 and write circuit 54 through latch circuit 17.

Meanwhile, in first cycle CY1, write data Din0 is input at data input/output pin 4 and applied to latch circuit 25 through buffer circuit 67. At the time, output enable signal NOE is in H level, and in response, tri-state buffer circuit 68 is in a high impedance state. Write data Din0 is thus input.

In first cycle CY1, latch circuit 25 passes write data Din0 in first phase Ph1, and latches write data Din0 in second phase Ph2. Thus, in first cycle CY1, write data Din0 is applied from data input/output pin 4 to write circuit 54 via buffer circuit 67 and latch circuit 25.

Therefore, in the period of first cycle CY1, data is written into a memory cell in memory cell array 51 which is selected based on internal address signal RADD applied to decoder 52.

Then, reading of data is executed. In the first phase Ph1 of second cycle CY2, internal address signal RADD indicating address A1 is applied to decoder 52, and internal write enable signal NWEin in H level is applied to read circuit 53 and write circuit 54.

Since internal write enable signal NWEin is in H level, read circuit 53 operates. Thus, data is read out from a memory cell in memory cell array 51 which is selected based on address A1.

In the second phase Ph2 of second cycle CY2, latch circuit 18 passes data RD read out from read circuit 53 (hereinafter referred to as read data). Then, in the first phase Ph1 of third circle CY3, latch circuit 19 passes read data RD applied from latch circuit 18.

Since in this state, external output enable signal NOE is in L level, tri-state buffer circuit 68 externally outputs the read data passed through latch circuit 19 from data input/output pin 4. The read data is denoted by "Dout1" in FIG. 11.

Thus, in a conventional synchronous SRAM, a writing operation is executed in one cycle while a reading operation is executed in two cycles.

The above conventional synchronous SRAM is however encountered with the following disadvantage. If, for example, reading operations and writing operations are executed in a sequence as illustrated in FIG. 11, and a reading operation is executed following a writing operation, read data Dout1 read in second cycle CY2 is being output at data input/output pin 4 as shown in third cycle CY3. Accordingly, in third cycle CY3, write data cannot be taken in from data input/output pin 4, and therefore data cannot be written. The data writing operation therefore must be executed in fourth cycle CY4, one cycle delayed from third cycle CY3.

Data cannot be written in third cycle CY3 as described above directly because read data and write data collide with each other. Such state is generally called resource conflict.

Such conflict of resources will be more specifically described. A synchronous SRAM is roughly divided into three resources. The first resource is memory core 50. The second resource is the address/control input bus, in other words address input pin 1 and control input pins 2 and 3. The third resource is the data bus, in other words data input/output pin 4.

FIG. 12 is a schematic representation for use in illustration of timings for basic use of the resources of a conventional synchronous SRAM. In FIG. 12, a timing for use of the resources at the time of reading operation and a timing for use of resources at the time of writing operation are shown.

In FIG. 12, the first resource is represented as RAM. The second resource is represented as AD. The third resource is represented as DIN and DOUT. Resource DIN corresponds to input/output pin 4 used at input of write data, and resource DOUT corresponds to data input/output pin 4 used at output of read data.

In FIG. 12, the longitudinal side of the block of each resource corresponds to time. A reading operation is indicated as "READ" and a writing operation is indicated as "WRITE".

Three use cycles #1 to #3 are necessary for executing a reading operation. More specifically, in first use cycle #1, resource AD is used in response to input of external address signal ADD, and in the second use cycle #2 resource RAM is used for data reading from memory cell array 51, and in the third use cycle #3 resource DOUT is used for externally outputting the read data.

Meanwhile, two use cycles #1 and #2 are necessary for executing a writing operation. More specifically, in first use cycle #1, resource AD is used in response to input of address signal ADD, and in the second use cycle #2 resource DIN and resource RAM are used for input of data and writing of the data.

Now, an operation of a conventional synchronous SRAM in a timing for use of the resources as shown in FIG. 12 will be described.

FIG. 13 is a schematic representation showing timings for use of resources at the operation of a conventional synchronous SRAM. In FIG. 13, timings for use of resources are shown when writing, reading, reading, writing, writing, reading and writing operations are sequentially executed. The longitudinal direction also corresponds to time in FIG. 13.

Referring to FIG. 13, a series of writing and reading operations should be executed basically as follows for implementation of high speed operation of the synchronous SRAM. More specifically, immediately after use of resource AD for a writing operation or a reading operation is completed, that resource AD is used for the next writing or reading operation.

Operations conducted on such basis however cause a conflict of resources, because resource DOUT and resource DIN are used in the same use cycle in a writing operation executed immediately after a reading operation. Accordingly, in the series of operations in FIG. 13, a writing operation immediately after a reading operation is delayed (STL in FIG. 13) in order to avoid such a conflict of resources.

Such delay of writing operation however impedes the high speed operation of the synchronous SRAM.

As a solution to this problem, data input/output pin 4 could be divided into an input dedicated pin and an output dedicated pin. In this case, however, the number of pins increases which pushes up chip cost and package cost, and in addition the area of the board for packaging increases, resulting in increase of system cost.

SUMMARY OF THE INVENTION

It is an object of the invention to provide a synchronous random access memory permitting high speed operation of cache memories and improvement of the speed performance of computers of various levels such as supercomputers, large size calculators, work stations and personal computers.

Another object of the invention is to provide a synchronous random access memory which eliminates delay of a writing operation immediately after a reading operation without increasing chip cost, package cost, and system cost.

Yet another object of the invention is to prevent, a conflict of resources in a synchronous random access memory.

A synchronous random access memory according to the present invention includes a memory cell array, a read/write circuit, a data hold circuit, an address signal hold circuit, a select circuit, a decode circuit, a comparison circuit and a select output circuit.

The memory cell array includes a plurality of memory cells. The read/write circuit responds to a read/write control signal and reads/writes from/to a memory cell in the memory cell array selected corresponding to an internal address signal based on an external address signal.

The data hold circuit takes in data for writing into a memory cell in the memory cell array and holds the data excluding the period during which data is being externally output. The address signal hold circuit holds an internal address signal corresponding to the data held by the data hold circuit.

The select circuit receives an internal address signal for reading data, and the internal address signal held in the address signal hold circuit, and selectively outputs these internal address signals in response to a read/write control signal for reading or writing.

The decode circuit selects a memory in the memory cell array in response to the internal address signal output from the select circuit. The comparison circuit compares the internal address signal for reading data and the internal address signal held by the address hold circuit in order to output data.

The select output circuit receives the data held by the data hold circuit and the data read out by the read/write circuit, and selectively outputs these data based on the result of comparison by the comparison circuit, when data is externally read out.

The data to be written into the memory cell array is taken and held by the data hold circuit in a timing in which data is not being externally output. Accordingly, a conflict of resources does not occur between read data and write data.

The internal address signal corresponding to the data held in the data hold circuit is held by the address hold circuit and the held internal address signal is applied to the decode circuit from the select circuit at the time of writing in response to the read/write control signal.

Accordingly, the period to use the memory cell array for writing of the held data can be prolonged through the following period in which the memory cell array is not used at the time of data writing.

Therefore, a conflict of resources does not occur in the memory cell array. In addition, if held data is read out, the held internal address signal coincides with the internal address for reading data.

Therefore, if such a coincidence is found based on a comparison result from the comparison circuit, the held data may be output from the select output circuit. Accordingly, a request of reading data which has not yet been written in the memory cell array can be coped with.

Since a conflict of resources can be prevented as described above, delay of a writing operation following a reading operation can be eliminated without increasing chip cost, package cost, and system cost. As a result, high speed operation of cache memories can be achieved, and the speed performance of computers of various levels such as supercomputers, large size calculators, work stations and personal computers can be achieved.

In addition, an internal clock generation circuit, a first logic circuit, and a second logic circuit may be further provided, and the data hold circuit may include a first latch circuit and the address signal hold circuit may include a second latch circuit.

In such a case, the internal clock generation circuit generates an internal clock signal in response to an external clock signal. The first logic circuit generates a first logic signal in response to a delayed read/write control signal and the internal clock signal. The first latch circuit latches data to be written in a memory cell in the memory cell array in response to the first logic signal. The second logic circuit generates a second logic signal in response to the internal clock signal and the read/write control signal. The second latch circuit latches an internal address signal corresponding to data held by the data hold circuit in response to the internal clock signal and the read/write control signal.

In addition, the select circuit may include a first multiplexer circuit, and the select output circuit may include a second multiplexer circuit.

The first multiplexer circuit applies an internal address signal for reading data to the decode circuit when the read/write control signal designates a reading, and applies an internal address signal held by the address hold circuit to the decode circuit when the read/write control signal designates a writing.

The second multiplexer circuit outputs data held by the data hold circuit when the internal address signals compared by the comparison circuit coincide, and outputs data read out by the read/write circuit when the internal address signals compared by the comparison circuit do not coincide.

A synchronous random access memory according to another aspect of the invention includes a memory cell array, a read/write circuit, a data hold circuit, an address signal hold circuit, a first select circuit, a decode circuit, a comparison circuit, a second select circuit and a select output circuit.

The memory cell array includes a plurality of memory cells. The read/write circuit responds to a read/write control signal and reads/writes data from/to a memory cell in the memory cell array selected corresponding to an internal address signal based on an external address signal.

The data hold circuit sequentially takes in a plurality of pieces of data for writing into memory cells in the memory cell array and holds the data in a sequence excluding the period during which the data is being externally output. The address signal hold circuit holds internal clock signals corresponding to these plurality of pieces of data held by the data hold circuit in a sequence corresponding to the sequence of these plurality of pieces of data.

The first select circuit receives an internal address signal for reading data, and the internal address signal held by the address signal hold circuit which comes first in the sequence, and selectively outputs these internal signals in response to the read/write control signal for reading or writing.

The decode circuit selects a memory cell in the memory cell array in response to the internal address signal output from the first select circuit. The comparison circuit compares the internal address signal for reading out data, and the respective plurality of internal address signals held by the address signal hold circuit in order to output data.

The second select circuit receives the plurality of pieces of data held by the data hold circuit and selectively outputs these pieces of data based on the result of comparison by the comparison circuit, when data is externally read out.

The select output circuit receives the data output from the second select circuit and the data read out by the read/write circuit, and selectively outputs these pieces of data based on the result of comparison by the comparison circuit, when data is externally read out.

Data to be written into the memory cell array is taken in by the data hold circuit when data is not being externally output and a plurality of such data is held in the data hold circuit. Therefore, a conflict of resources does not occur between read data and write data.

A plurality of internal address signals corresponding to the plurality of pieces of data held in the data hold circuit are held by the address hold circuit in a prescribed order, and the hold internal address signals are provided to the decode circuit from the select circuit at the time of writing in response to a read/write control signal, starting from a signal which comes first in the order.

Thus, the period to use the memory cell array for writing the held data can be prolonged through the following period in which the memory cell array is not used which exists at the time of data writing. The prolonged period is determined depending upon the number of address signals and the number of pieces of data held.

Accordingly, a conflict of resources does not occur in the memory cell array. In addition, since the period to take in data does not overlap the period in which the memory cell array is used, a room is provided for timings for taking in data and use of the memory cell array.

Furthermore, if held data is to be read out, one of the held address signals coincides with an internal address for reading data.

Accordingly, if such a coincidence is found depending upon a comparison result from the comparison circuit, one of the held data may be output from the select output circuit. Accordingly, a request of reading of data which has not yet been written in the memory cell array can be coped with.

As described above, since a conflict of resources can be prevented, delay of a writing operation following a reading operation can be eliminated without increasing chip cost, package cost, and system cost. As a result, high speed operation of cache memories can be achieved and the speed performance of computers of various levels such as supercomputers, large size calculators, work stations and personal computers can be achieved.

In addition, an internal clock generation circuit, a first logic circuit, and a second logic circuit may further be provided, the data hold circuit may include a plurality of first latch circuits, and the address signal hold circuit may include a plurality of second latch circuits.

In such a case, the internal clock generation circuit generates an international clock signal in response to an external clock signal. The first logic circuit generates a first logic signal in response to a delayed read/write control signal and the internal clock signal. The plurality of first latch circuits latch a plurality of pieces of data to be written in memory cells in the memory cell array in the sequence in which they are taken in, in response to the first logic signal.

The second logic circuit generates a second logic signal in response to the internal clock signal and the read/write control signal. The plurality of second latch circuits respond to the second logic signal and latch a plurality of internal address signals corresponding to a plurality of pieces of data to be written in memory cells in said memory cell array, respectively in a sequence corresponding to the sequence of the plurality of pieces of data.

A method of operating a synchronous random access memory according to yet another aspect of the invention is a method of operating a synchronous random access memory having read operations and write operations, each read and write operation executed sequentially, a read operation comprising a first step of fetching an address, a second step of accessing the random access memory array, and a third step of outputting data, the first through third steps performed in three distinct sequentially machine cycles, a write operation comprising a first step of fetching an address, a second step of accessing the random access memory array and a third step of inputting data, the first through third steps performed in at least three machine cycles with the second and third steps performed in the same machine cycle or a different machine cycle and the first step performed in a machine cycle which is distinct from the machine cycle in which the second and third steps are performed, the method comprising the step of:

when a write operation is followed by a read operation in the first machine cycle in which the write operation is, carrying out the first step of write operation, in the second machine cycle, carrying out the first step of the read operation, in the third machine cycle, carrying out the third step of the write operation and the second step of the read operation and delaying the second step of the write operation until the second cycle of the next following write operation, and in the fourth machine cycle, carrying out the third step of the read operation.

If a second write operation follows the write operation, the operation is carried out as follows.

In the first machine cycle, carrying out the first step of the write operation, in the second machine cycle, carrying out the first step of the second write operation, in the third machine cycle, carrying out the second and third steps of the write operation, and in the fourth machine cycle, carrying out the third step of the second write operation, and carrying out the second step of the second write operation when the next operation is a third write operation and delaying the second step of the second write operation until the second cycle of the next following write operation when the next operation is a read operation.

As described above, in carrying out a write operation, the second step of the write operation is carried out in the second machine cycle of the next write operation. The second step of the write operation is thus carried out in the third machine cycle or in the fourth machine cycle or after.

Use of such an operation method can prevent a conflict of resources from being generated. As a result, the operation of the memory can be performed at a high speed.

A method of operating a synchronous random access memory according to a still further aspect of the invention is a method of operating a synchronous random access memory having read operations and write operations, each read and write operation executed sequentially, a read operation comprising a first step of fetching an address, a second step of accessing the random access memory array, and a third step of outputting data, the first through third steps performed in three distinct sequential machine cycles, a write operation comprising a first step of fetching an address, a second step of accessing the random access memory array and a third step of inputting data, the first through third steps performed in distinct sequential machine cycles, the method including the steps of:

when a write operation is carried out, in the first machine cycle, carrying out the first step of the write operation, in the second machine cycle, carrying out the first step of a write operation or a read operation following the write operation, in the third machine cycle, carrying out at least the third step of the write operation and the first step of a write operation or a read operation following after next, and delaying the second step of the write operation until the second cycle of the third write operation after the fourth machine cycle.

Thus, when a write operation is carried out, the second step of the write operation is carried out in the second cycle of a write operation following the next write operation.

Use of such an operation method can prevent generation of a conflict of resources. As a result, the operation of the memory can be performed at a high speed. Furthermore, since the second and third steps of a write operation are not executed in a single machine cycle, an extra space can be secured for timings for fetching data and using the memory cell array.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the present invention will be described in detail in conjunction with the accompanying drawings.

First Embodiment

The concept of operation of a synchronous SRAM according to First Embodiment will be described.

Figure 1:
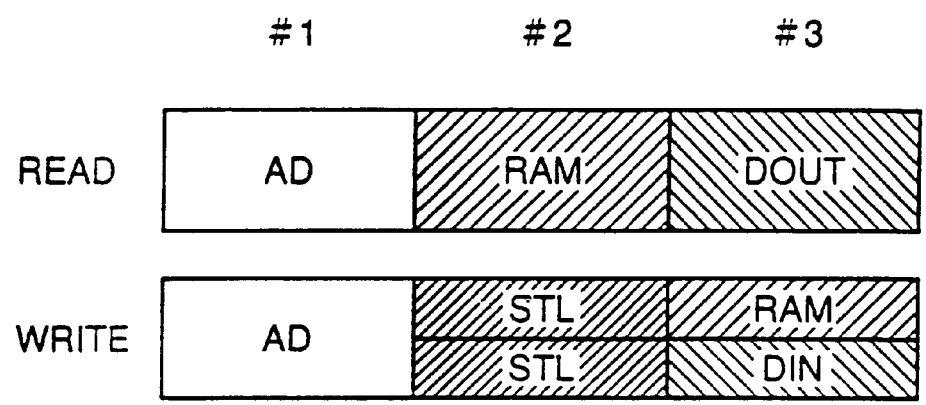
FIG. 1 is a schematic representation showing basic timings for use of resources in a synchronous SRAM according to a first embodiment.
Figure 12:
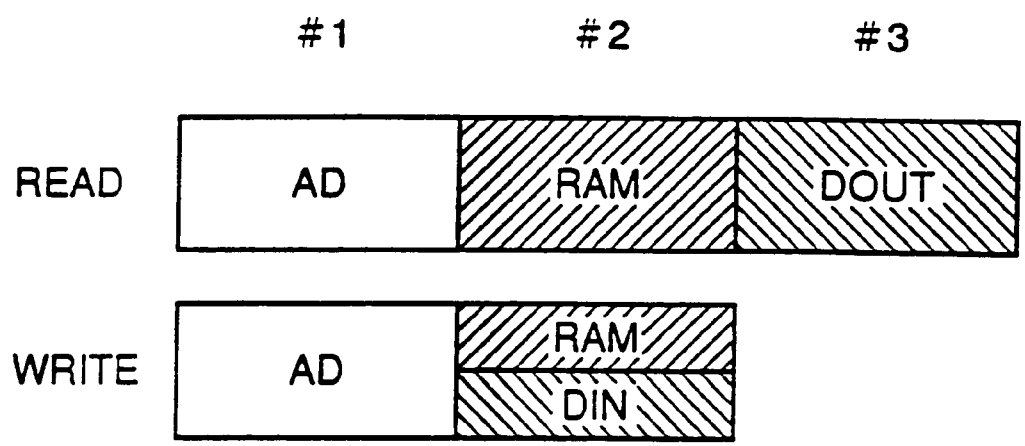
FIG. 12 is a schematic representation showing basic timings for use of resources in a conventional synchronous SRAM.

FIG. 1 is a schematic representation showing basic timings for use of resources in the synchronous SRAM according to First Embodiment. FIG. 1 corresponds to FIG. 12. The basic timings for use of the resources in FIG. 1 are different from those in FIG. 12 in a timing for use of the resources in a writing operation.

More specifically, a writing operation is basically executed in three use cycles #1 to #3. More specifically, resource AD is used in response to input of an address signal in the first use cycle, and no resource is used in the second use cycle, and resource RAM and resource DIN are used for input of data and writing of the data in the third use cycle.

More specifically, the second cycle is provided for delaying (STL in the figure) resource RAM and resource DIN. The writing operation shown in FIG. 1 is however a basic operation, and in practice resource RAM is sometimes delayed to after the third use cycle.

Figure 2:
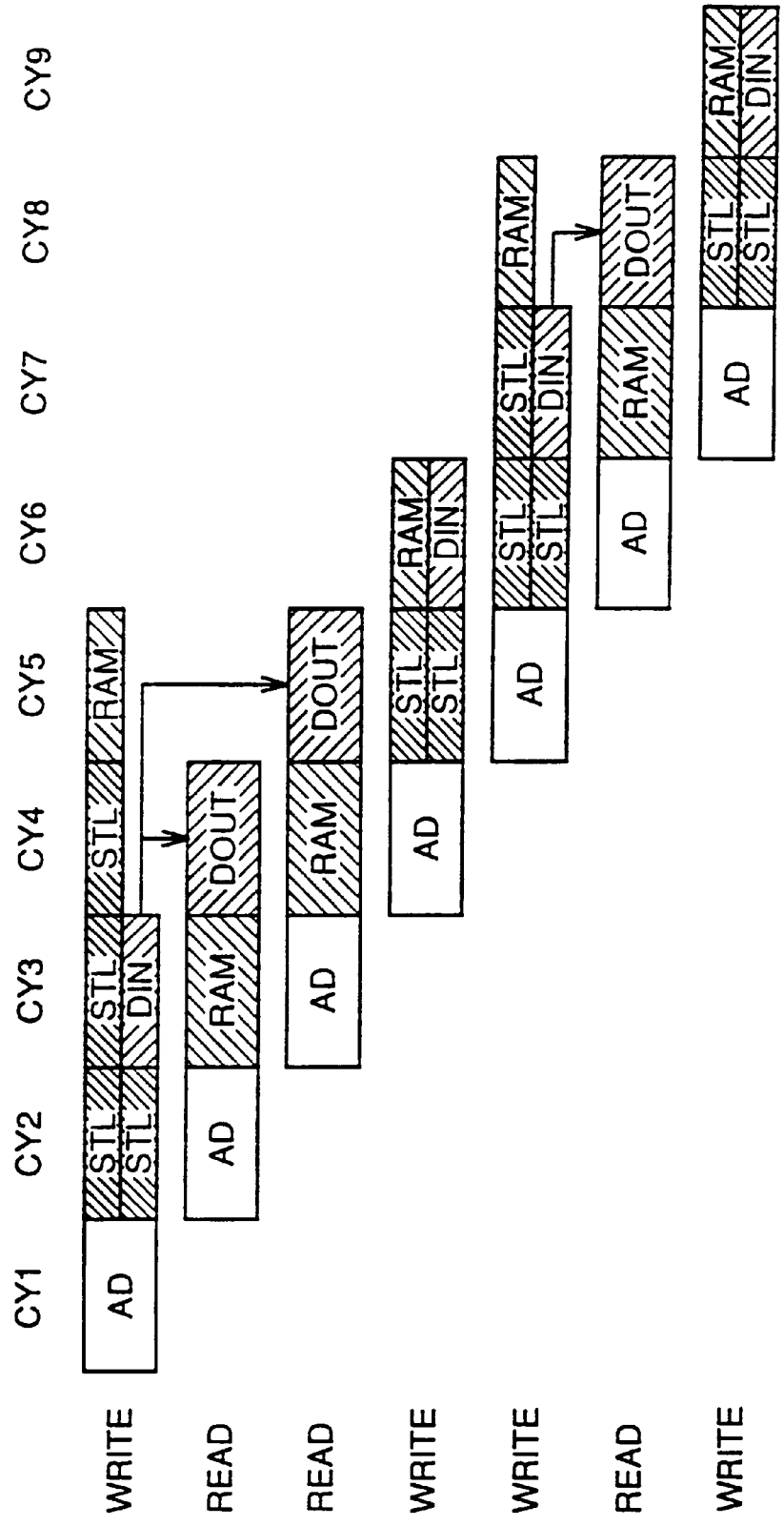
FIG. 2 is a schematic representation showing timings for use of the resources at the time of operation of the synchronous SRAM according to the first embodiment.

Now, an operation of the synchronous SRAM in the basic timings for use of the resources in FIG. 1 will be described. FIG. 2 is a schematic representation showing timings for use of resources at the time of the operation of the synchronous SRAM according to First Embodiment.

Figure 13:
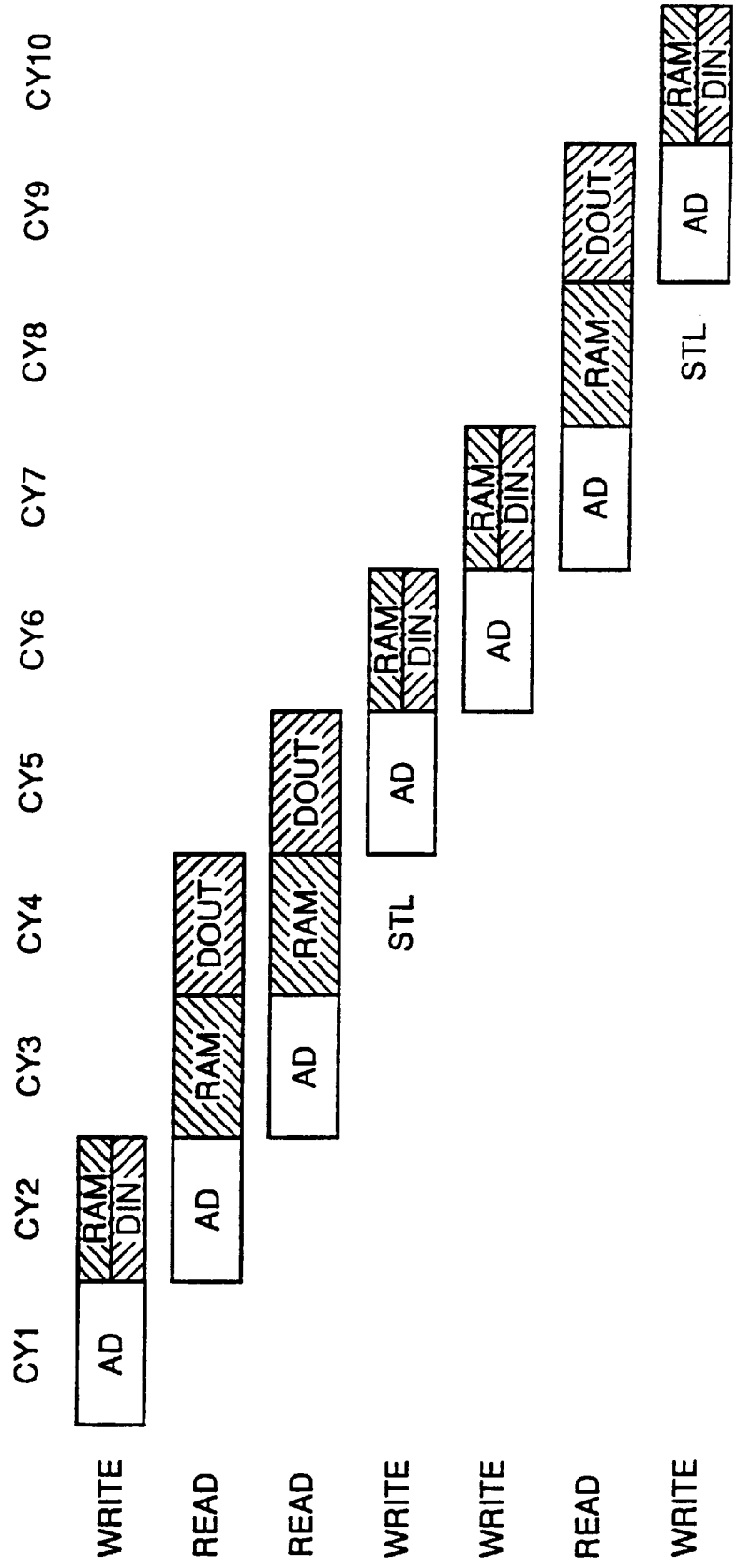
FIG. 13 is a schematic representation showing timings for use of resources at the time of the operation of a conventional synchronous SRAM.

The timings for use of the resources in FIG. 2 are different from those in FIG. 13 in the following points. Its timing for use of resource AD in a writing operation immediately after a reading operation is different. In addition, its timing for use of resource DIN in a writing operation based on the basic operation timing is different. Furthermore, resource RAM is used in the basic operation timing and in a timing more delayed from the timing.

The timings for use of resources DOUT and DIN are in the same third cycle as shown in FIG. 1. Therefore, as illustrated in FIG. 2, a conflict does not occur between resource DOUT and resource DIN if a reading operation or a writing operation is initiated in each cycle. Simply executing the basic use timings as shown in FIG. 1, however, causes a conflict of resources for resource RAM when a reading operation is conducted immediately after a writing operation.

In order to solve this problem, the timing for use of resource RAM in a writing operation is used in the second use cycle in the writing operation executed next. This is because the second use cycle in the writing operation does not use any resource.

Accordingly, data input in a writing operation will be written in the next writing operation. Accordingly, even if a number of series of writing operations are necessary, the number of data waiting to be written in an arbitrary period is one at most. Such operation for holding data can be implemented by the provision of the data hold circuit for holding write data and the address signal hold circuit for holding an address signal corresponding to the held data.

However, there is still the problem of how to cope with a request of reading data which is held, in other words has not yet been written. In this case, since data has not been yet written, held data must be externally output as read data. Accordingly, as illustrated in FIG. 2, in response to a request of a reading operation to write data held in a writing operation immediately before, the held data must be read out bypassing memory cell array 51 in the path as indicated by the arrow in the figure.

Figure 3:
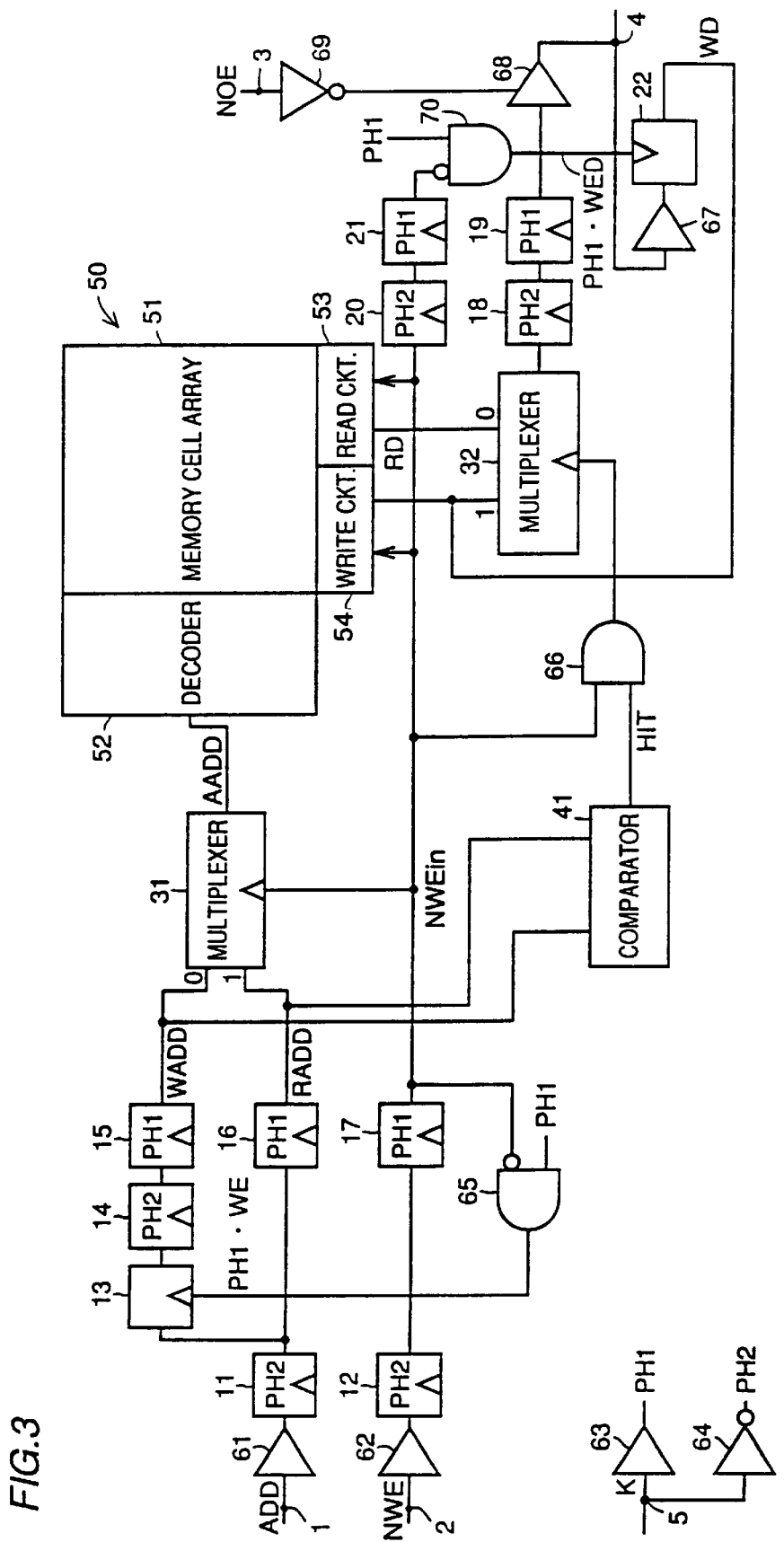
FIG. 3 is a block diagram showing the configuration of the synchronous SRAM according to the first embodiment.

Now, a specific example of such a synchronous SRAM implementing the timing for use of resources as illustrated in FIG. 2 will be described. FIG. 3 is a block diagram showing the configuration of the synchronous SRAM according to First Embodiment.

Figure 10:
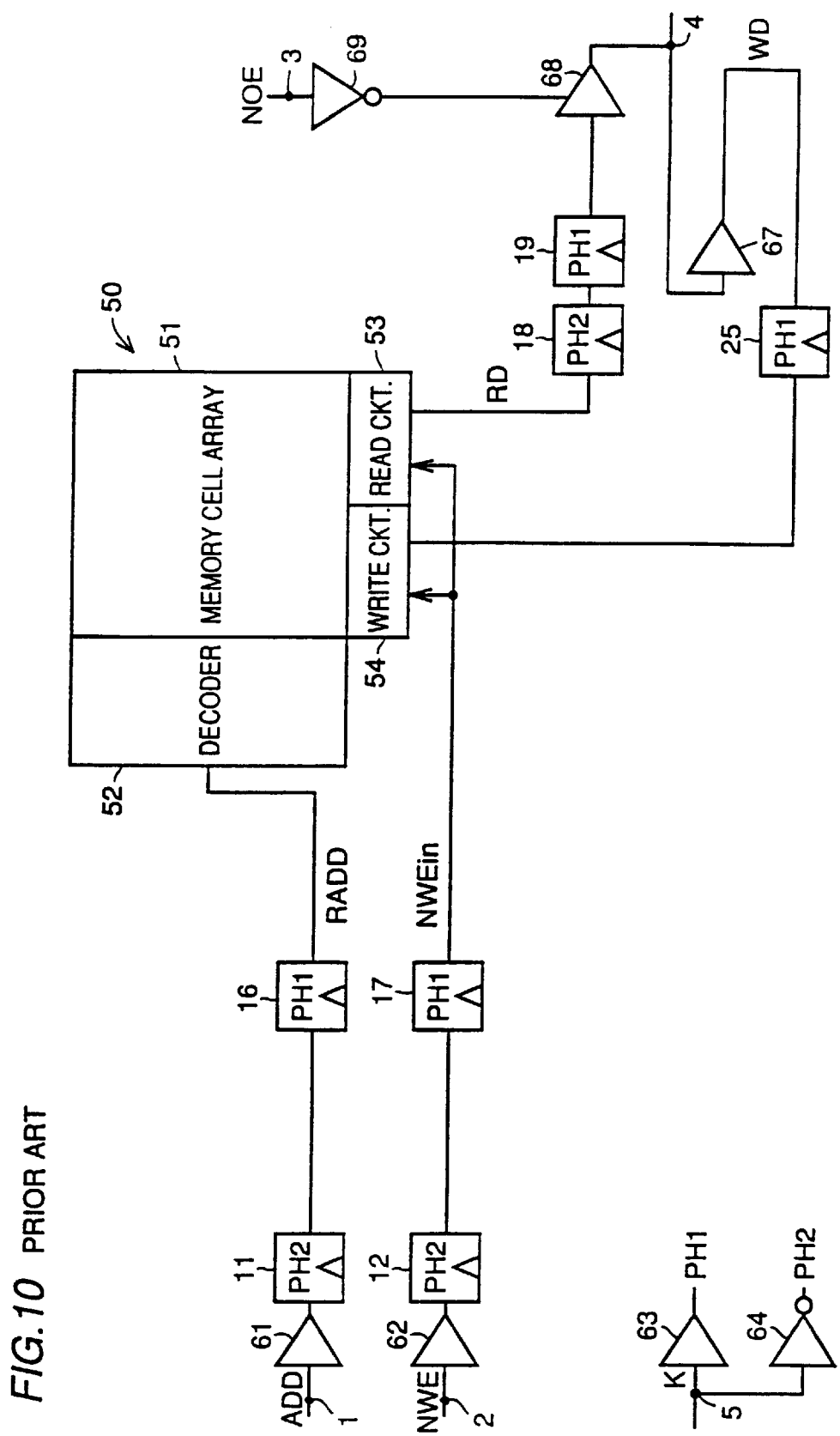
FIG. 10 is a block diagram showing the configuration of another conventional synchronous SRAM.

The synchronous SRAM in FIG. 3 is different from FIG. 10 in that latch circuit 25 in FIG. 2 is removed, and latch circuits 13, 14, 15, 20, 21, and 22, multiplexers 31 and 32, a comparator 41, and logic gates 65, 66, and 70 are additionally provided. Latch circuits 13 and 14 constitute a register.

An external address signal ADD is input at address input pin 1 and applied to latch circuit 11 through buffer circuit 61. An output signal from latch circuit 11 is applied to multiplexer 31 as an internal address signal WADD through latch circuits 13, 14, and 15, and provided to multiplexer 31 through latch circuit 16 as an internal address signal RADD.

An external write enable signal NWE is input at control input pin 2 and applied to latch circuit 17 through buffer circuit 62 and latch circuit 12.

An internal write enable signal NWEin, an output signal from latch circuit 17 is applied to multiplexer 31, read circuit 53, write circuit 54 and logic circuit 65 and also applied to logic gate 70 through latch circuits 20 and 21. Note that internal write enable signal NWEin is inverted and then applied to logic gates 65 and 70.

Logic gates 65 and 70 receive an internal clock signal PH1 in addition to internal write enable signal NWEin. Logic gate 65 applies its output signal PH1·WE to latch circuit 13 as a control signal. Logic gate 70 applies its output signal PH1·WED to latch circuit 22 as a control signal.

The output signals of these logic gates 65 and 70 both attain H level when internal write enable signal NWEin is in H level and internal clock signal PH1 is in H level.

Externally applied write data is input at data input/output pin 4 and applied to latch circuit 22 through buffer circuit 67. Write data WD, the output signal of latch circuit 22 is applied to write circuit 54 and multiplexer 32. Multiplexer 32 also receives read data RD output from read circuit 53.

Comparator 41 receives internal address signals WADD and RADD. The output signal HIT of comparator 41 is applied to logic gate 66. Output signal HIT attains H level when internal address signals WADD and RADD coincide with each other.

Logic gate 66 also receives internal write enable signal NWEin. The output signal of logic gate 66 is applied to multiplexer 32 as a control signal. The output signal of logic gate 66 attains H level when the applied output signal HIT and internal write enable signal NWEin are both in H level.

Multiplexer 32 outputs write data WD if the control signal applied from logic gate 66 is in H level, while outputs read data RD if the control signal is in L level. The output signal of multiplexer 32 is applied to data input/output pin 4 through latch circuits 18, 19 and tri-state buffer circuit 68 and externally output.

Figure 4:
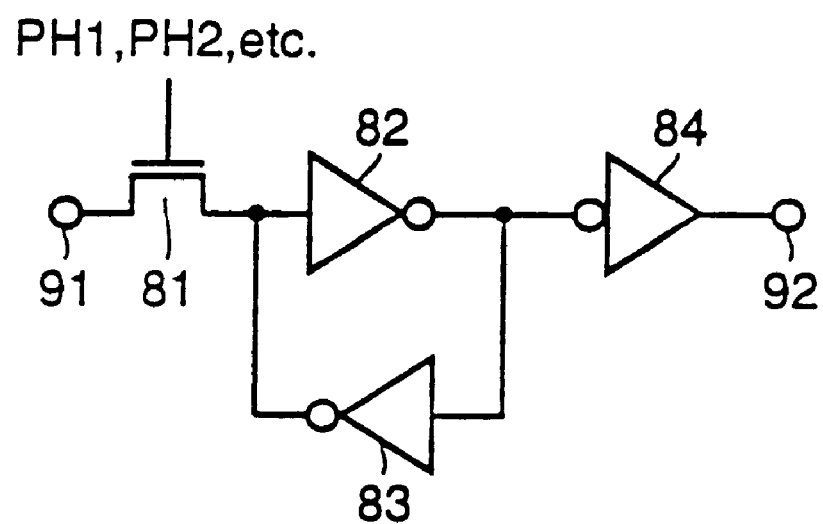
FIG. 4 is a circuit diagram showing the configuration of a latch circuit.

Latch circuits 11, 12, ... used in the synchronous SRAM in FIG. 3 will be described in detail. FIG. 4 is a circuit diagram showing the configuration or a latch circuit.

Referring to FIG. 4, in the latch circuit, connected between an input terminal 91 and an output terminal 92 are an MOS transistor 81, inverters 82 and 83 having their input terminals and output terminals connected each other, and an inverter 84.

Inverters 82 and 83 connected as in the above described manner have two stable states, and can hold 1-bit information. MOS transistor 81 receive internal clock signals PH1, PH2, control signal PH1·WE or control signal PHL·WED as a control signal at its gate.

Operation will be described. When MOS transistor 81 conducts in response to a signal received at its gate, data input from input terminal 91 is transferred into the latch circuit and output from output terminal 92. Meanwhile, when MOS transistor 81 is turned off in response to a signal applied at its gate, an output signal immediately before the transistor is turned off is held and the held output signal continues to be output from output terminal 92.

Figure 5:
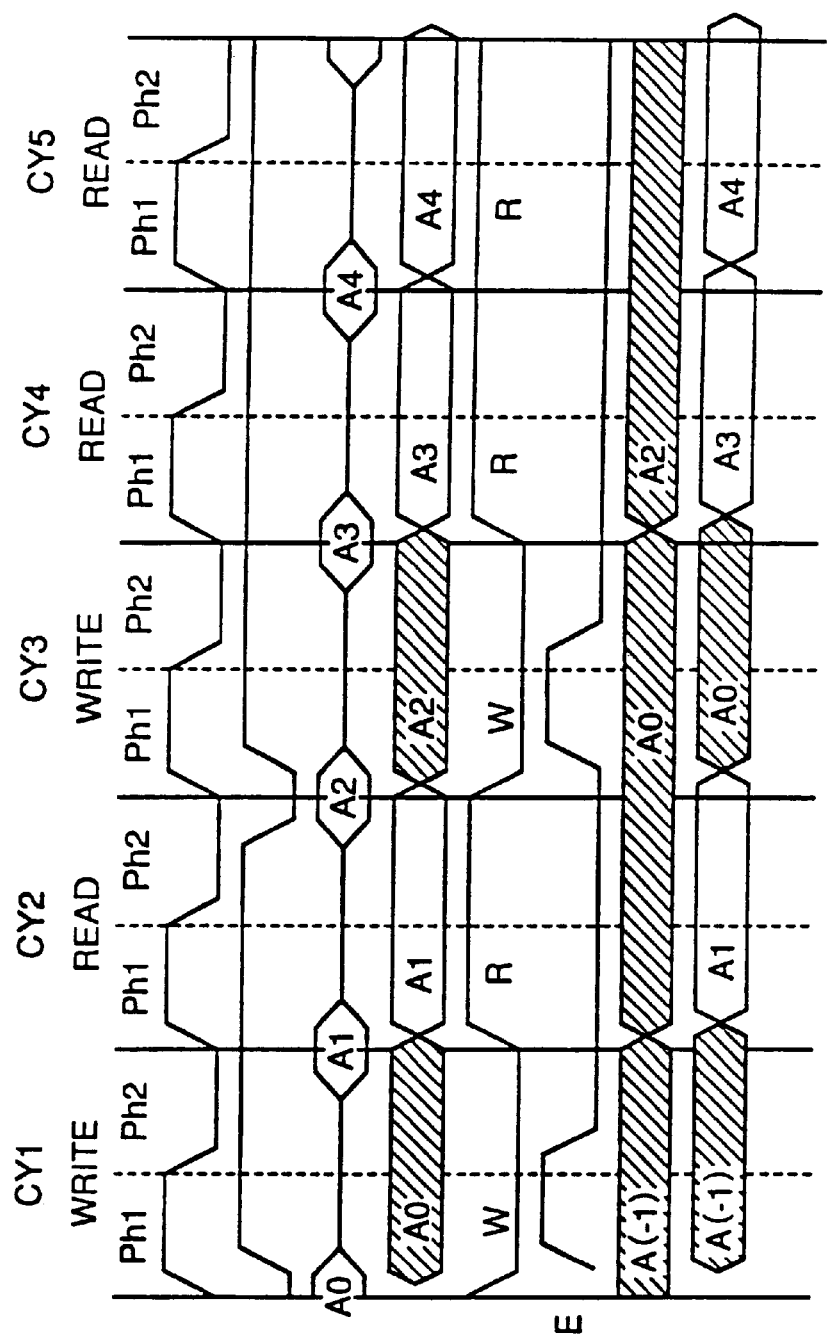
FIG. 5 is a timing chart for use in illustration of an operation related to producing of an internal address signal in the synchronous SRAM in FIG. 3.
Figure 6:
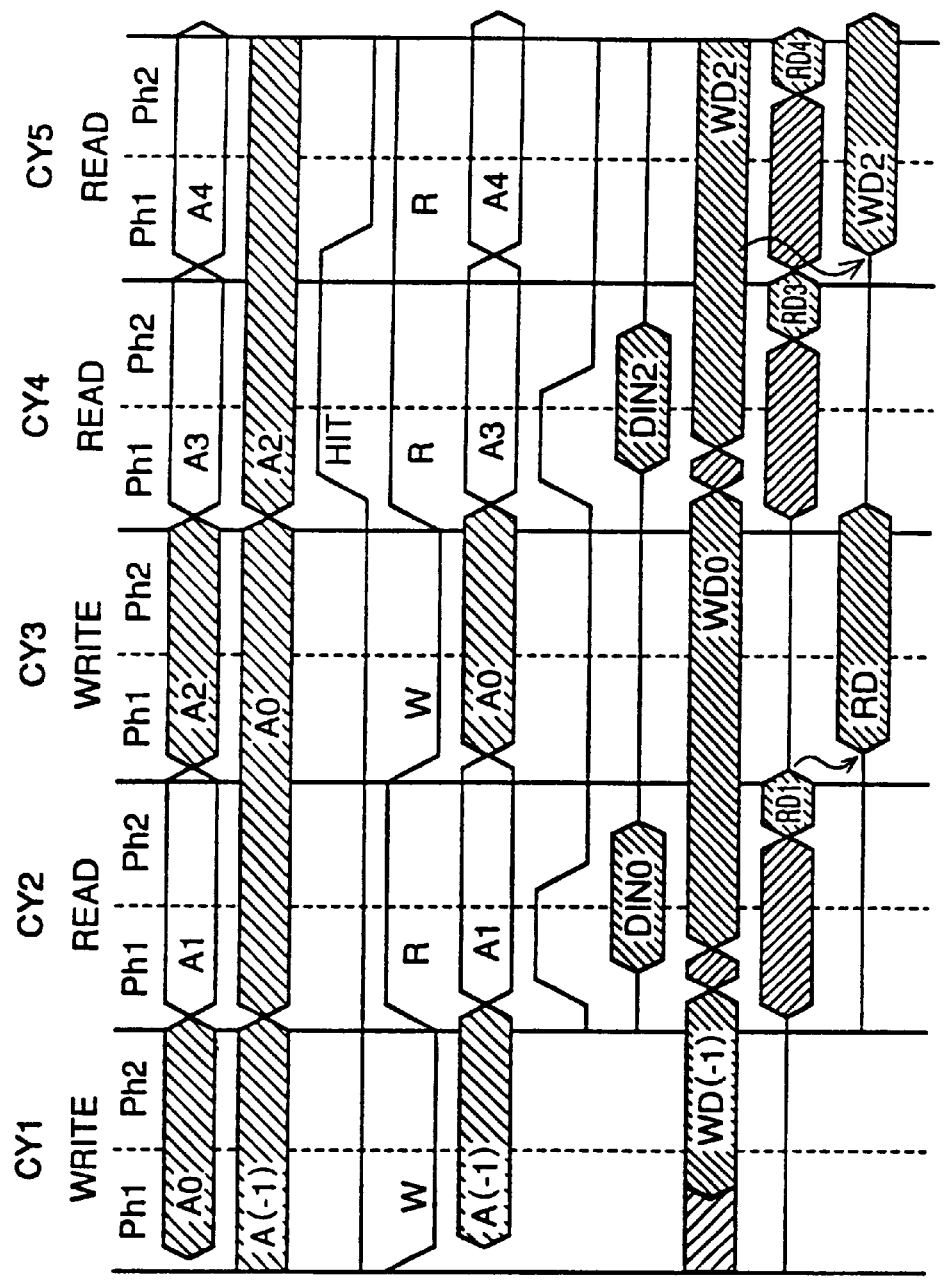
FIG. 6 is a timing chart for use in illustration of an operation related to writing and reading of data in the synchronous SRAM in FIG. 3.

Now, an operation of the synchronous SRAM shown in FIG. 3 will be described. FIG. 5 is a timing chart for use in illustration of operation related to producing of an internal address signal in the synchronous SRAM in FIG. 3. FIG. 6 is a timing chart for use in illustration of operation related to writing and reading of data in the synchronous SRAM in FIG. 3.

In FIGS. 5 and 6, writing, reading, writing, reading and reading operations are sequentially executed, and "WRITE" and "READ" indicated correspondingly to first cycle CY1~fifth cycle CY5 correspond to the second use cycles of the writing operation and the reading operation shown in FIG. 1, respectively.

For the series of operations in FIGS. 5 and 6, a writing operation executed in third cycle CY3, the data of address A3 the same as address A2 designated as an address for writing data is designated as an address for data reading in a reading operation in fourth cycle CY4. More specifically, it is assumed that address A2 and address A3 coincide with each other.

An operation related to producing of an internal address signal will be described in conjunction with FIG. 5. External write enable signal NWE and external address signal ADD are sampled at a rising edge of external clock signal K at the start of the period of first cycle CY1. Thus, internal write enable signal NWEin falls to L level, and internal address signal ADD designates address A0. Then, since internal write enable signal NWEin attains L level and internal clock signal PH1 attains H level, the output signal of latch circuit 11 corresponding to external address signal ADD is taken into the register formed of latch circuits 13 and 14 and held therein.

Thus held address signal passes latch circuit 14 in the second phase Ph2 of the first cycle CY1 and then passes latch circuit 15 in the first phase Ph1 of the second cycle CY2 and applied to multiplexer 31 as an internal address signal WADD.

Thus, since the address signal is taken into latch circuit 13 only in the period of first phase Ph1 in writing operation, only addresses A(-1), A0, and A2 for writing operation correspond internal address signal WADD.

Multiplexer 31 selects internal address signal WADD if internal write enable signal NWEin is in L level, and applies the selected signal to decoder 52 as an internal address signal AADD. Meanwhile, if internal write enable signal NWEin is in H level, multiplexer 31 selects internal address signal RADD and applies the selected signal to decoder 52 as an internal address signal AADD.

Accordingly, in reading, internal address signal RADD for reading is provided to decoder 52 in the period of the reading operation. Meanwhile, in writing, internal address signal WADD corresponding to a writing operation immediately before is applied to decoder 52.

Now, referring to FIG. 6, an operation related to writing and reading of data will be described.

In a writing operation executed in first cycle CY1, address A0 designated by internal address signal RADD related to writing of data corresponds to data DIN0 indicated in data DDIN.

Data DIN0 is taken into latch circuit 22 in response to the output signal PH1·WED of logic gate 70 which attains H level in the first phase Ph1 of the second cycle CY2, and output from latch circuit 22 as write data WD0. Write data WD0 is held until the start of fourth cycle CY4.

Then, in a reading operation executed in second cycle CY2, data RD1 corresponding to address A1 designated by internal address signal RADD for reading of data is read out from memory cell array 51 and appears in read data RD output from read circuit 53.

In second cycle CY2, since internal address signals RADD and WADD do not coincide, the output signal HIT of comparator 41 is in L level. Accordingly, data RD1 is applied to data input/output pin 4 from multiplexer 32 through latch circuits 18, 19 and tri-state buffer circuit 68.

A writing operation executed in third cycle CY3 is executed similarly to the writing operation started in first cycle CY1. In this case, the address of internal address signal AADD applied to decoder 52 is address A0 indicated in internal address signal WADD shown in FIG. 6.

Accordingly, in third cycle CY3, data WD0 is written in a memory cell corresponding to address A0 in memory cell array 51. More specifically, in the writing operation, writing based on address A0 held in the previous writing operation and data WD0 is executed.

In a reading operation executed in fourth cycle CY4, address A3 in coincidence with address A2 designated by the writing operation immediately before is designated as an address for reading.

In the first phase Ph1 of fourth cycle CY4, the output signal PH1·WED of logic gate 70 attains H level, and therefore data DIN2 for writing related to the writing operation in third cycle CY3 is taken into latch circuit 22 and output from latch circuit 22 as data WD2 shown in FIG. 6. Accordingly, write data WD in this case is data WD2.

Meanwhile, in comparator 41, internal address signals WADD and RADD coincide with each other, and output signal HIT attains H level. As a result, write data WD (WD2) will be output from multiplexer 32.

Thus, in the following fifth cycle CY5, data WD2 is provided to data input/output pin 4. More specifically, data WD2 becomes output data Dout.

As described above, in the synchronous SRAM in FIG. 3, the operations as shown in FIGS. 1 and 2 can be implemented. Accordingly, a conflict of resources at data input/output pin 4 does not occur, and no conflict of resources is generated in memory core 50.

Furthermore, even if a reading operation to data which is designated in the previous writing operation and has not yet been written is requested, the data can be read out smoothly as described above.

In view of the foregoing, the following effects are brought about according to First Embodiment.

Since data to be written into a memory cell array is taken in when data read out from the memory cell array is not being output externally, a conflict of resources at a portion related to external output can be prevented.

Furthermore, since data to be written in a memory cell and an internal address signal are held, the period to use the memory cell for writing the held data can be prolonged through the period in which the memory cell array is not used in the following data writing. As a result, a conflict of resources in the memory cell array can be prevented.

In addition, if held data which has not yet been written should be read, the held data is directly read out, and therefore a disadvantage at the time of reading associated with such holding of data is eliminated.

As described above, since a conflict of resources can be prevented, delay of a writing operation following a reading operation can be eliminated without increasing chip cost, package cost, and system cost. As a result, high speed operation of cache memories can be achieved, and the speed performance of computers of various levels such as supercomputer, large size calculator, work station and personal computer can be improved.

Second Embodiment

Now, Second Embodiment will be described.

Referring to FIG. 2, in the synchronous SRAM according to First Embodiment, in a writing operation immediately after the previous writing operation, resource RAM and resource DIN used in the previous writing operation are both used in the cycle immediately after the resource AD in the latter writing operation.

More specifically, referring to FIG. 3, data should be transferred from data input/output pin 4 to write circuit 54 and then written in memory cell array 51 in the same one cycle.

Accordingly, a room for timings for transfer and writing of data is limited.

In the following descriptions, in the synchronous SRAM according to Second Embodiment, rooms are provided for timings for transfer and writing of data.

As is the case with First Embodiment, use timings for a reading operation and a writing operation will be described.

Basic timings for use of the resources of the synchronous SRAM according to Second Embodiment are the same as those shown in FIG. 1.

Figure 7:
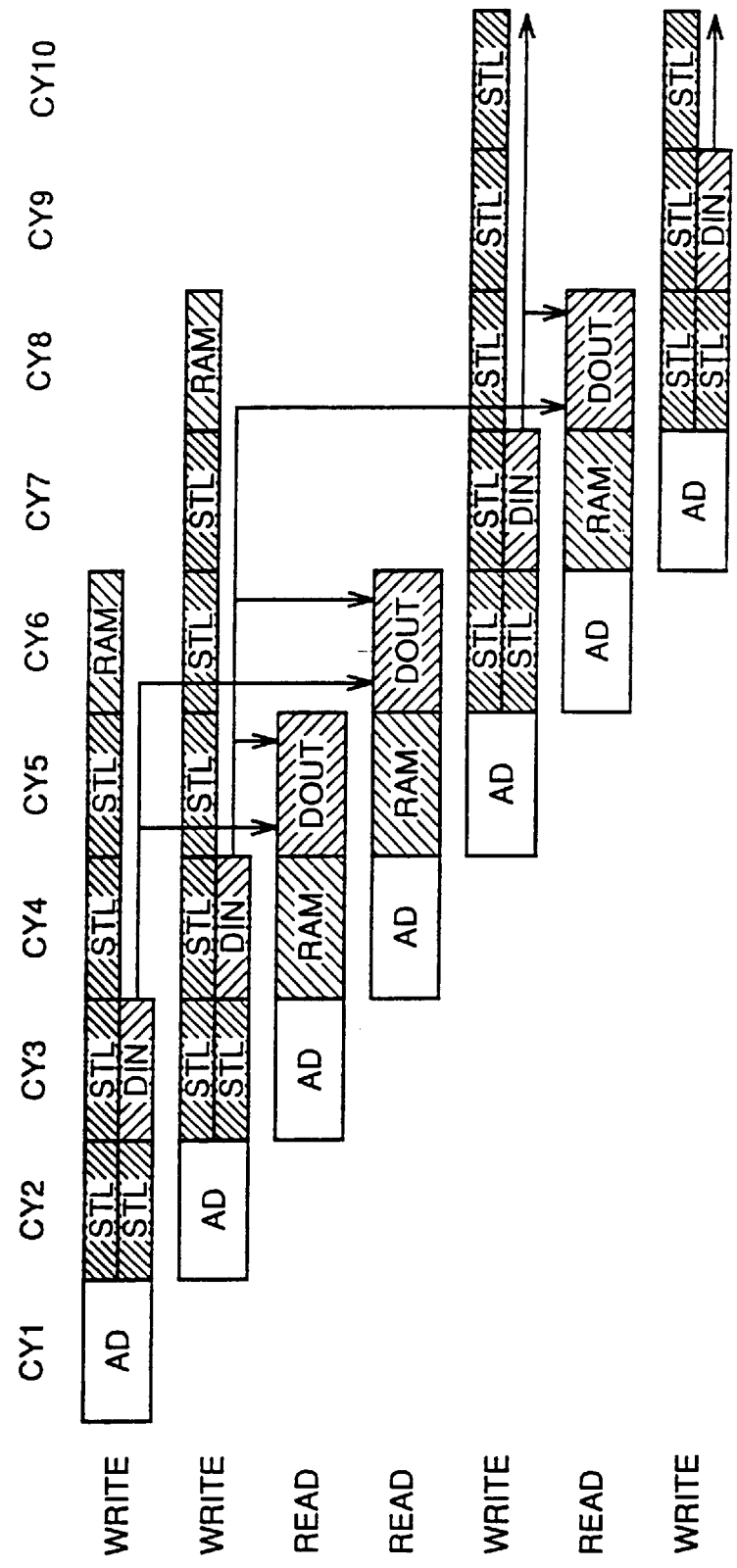
FIG. 7 is a schematic representation showing timings for use of resources at the time of operation of a synchronous SRAM according to a second embodiment of the invention.

Timings for use of the resources at the time of a specific operation will be described. FIG. 7 is a schematic representation for use in illustration of timings for use of resources at the time of operation of the synchronous SRAM according to Second Embodiment.

FIG. 7 corresponds to FIG. 2. In FIG. 7, illustrated timings for use of the resources are when writing, writing, reading, reading, writing, reading and writing operations are sequentially executed.

Referring to FIG. 7, the timings for use of the resources in FIG. 7 are different from those in FIG. 2 in that the timing for use of resource RAM is delayed to a writing operation after the next rather than to the next writing operation. Accordingly, resource RAM corresponding to a writing operation is used in a second use cycle for a writing operation after the next.

In such series of writing operations and reading operations, a reading operation of data which has not yet been written in the memory cell array might be requested. In such a case, as indicated by the arrow in FIG. 7, data which has not yet been written is used as read data at the time when resource DOUT is used. Thus, data reading can be smoothly conducted.

Figure 8:
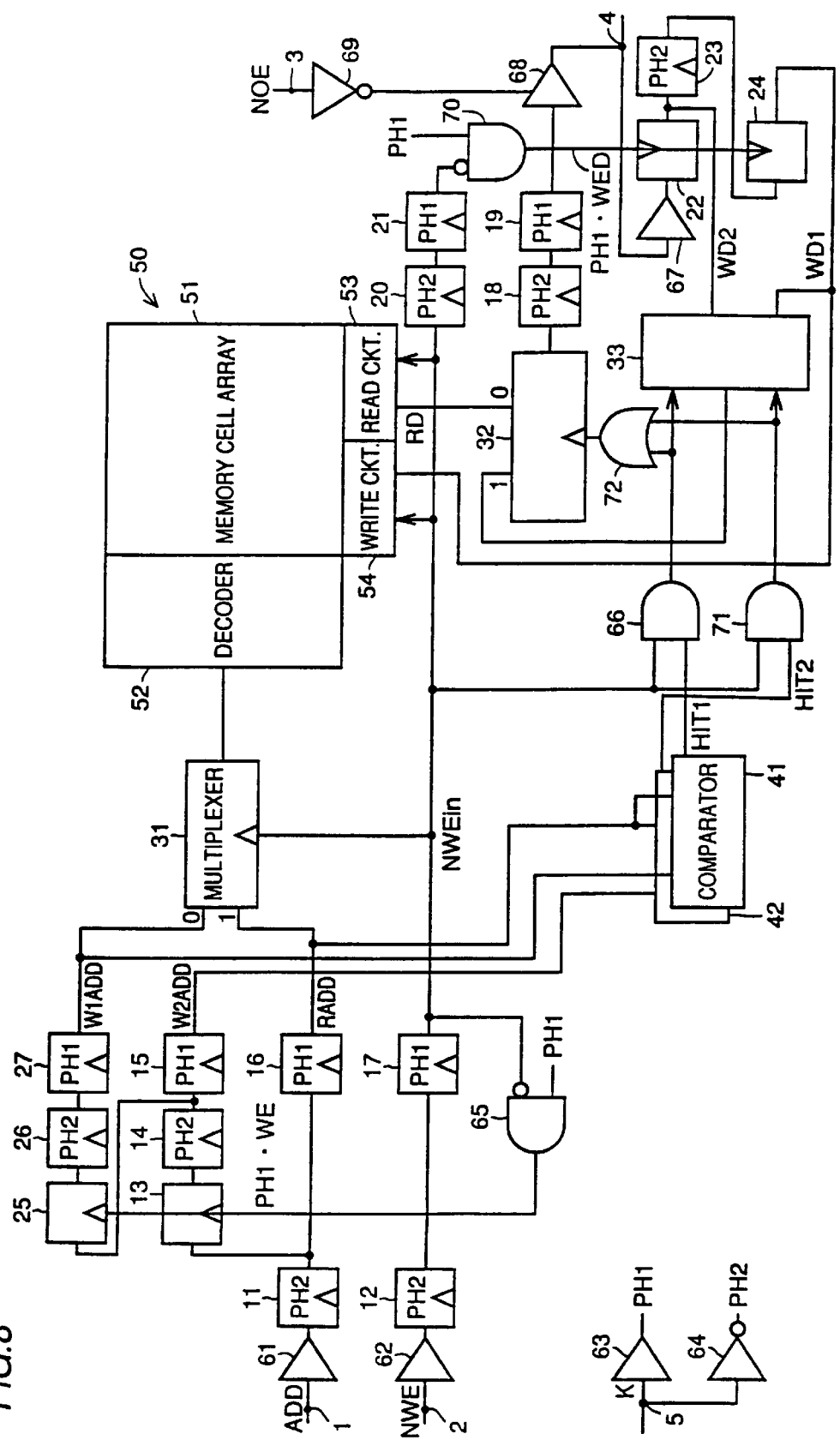
FIG. 8 is a block diagram showing the configuration of the synchronous SRAM according to the second embodiment.
Figure 9:
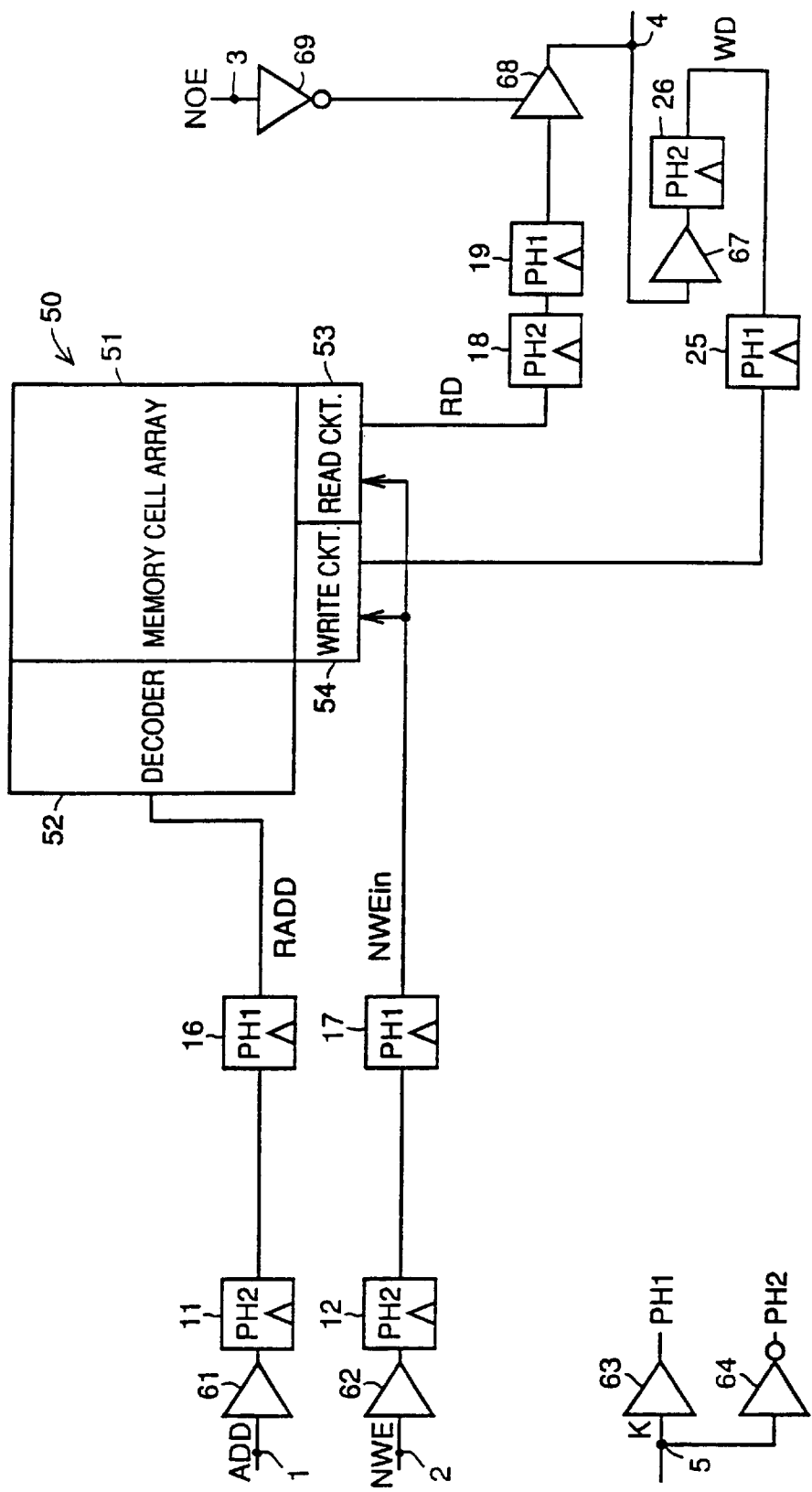
FIG. 9 is a block diagram showing the configuration of a conventional synchronous SRAM.

Now, the synchronous SRAM implementing use timings shown in FIG. 7 will be described. FIG. 8 is a block diagram showing the configuration of the synchronous SRAM according to Second Embodiment.

The synchronous SRAM in FIG. 8 is different from FIG. 3 in its portion holding address signals related to writing of data, its portion for comparing internal address signals, and its portion holding data related to writing.

Now, these different portions will be described. Referring to FIG. 7, the portion holding address signals related to writing is different from FIG. 2 in that latch circuits 25, 26, and 27 are additionally provided.

The output signal of latch circuit 14 is applied to latch circuits 15 and 25. Latch circuit 25 operates in response to the output signal PH1·WE of logic gate 65. The output signal of latch circuit 25 is applied to multiplexer 31 and comparator 41 as an internal address signal W1ADD through latch circuits 26 and 27. Latch circuit 26 operates in response to internal clock signal PH2 and latch circuit 27 operates in response to internal clock signal PH1.

Latch circuit 15 unlike that in FIG. 3 applies its output signal as an internal address signal W2ADD to comparator 42 which will be described later.

Thus, two internal address signals W1ADD and W2ADD are always held.

The portion for comparing internal address signals in FIG. 8 is different from that in FIG. 3 in that comparator 42 and a logic gate 71 are additionally provided. Comparator 41 and 42 receive internal address signal RADD in addition to the above-described internal address signals W1ADD and W2ADD.

Comparator 41 pulls output signal HIT1 to H level when input internal address signals W1ADD and RADD coincide. Comparator 42 pulls output signal HIT2 to H level when input internal address signals W2ADD and RADD coincide.

Logic gates 66 and 71 receive internal write enable signal NWEin in addition to output signals HIT1 and HIT2 described above. Logic gates 66 and 71 each pull an output signal to H level when input two signals are both in H level.

Thus, internal clock signals W1ADD and W2ADD are compared with internal address signal RADD, respectively.

The portion for holding data related to writing in FIG. 8 is different from that in FIG. 3 in that latch circuits 23 and 24 are additionally provided.

The output signal of latch circuit 22 is applied to write circuit 54 through latch circuits 23 and 24. Latch circuit 23 operates in response to internal clock signal PH2, and latch circuit 24 operates in response to the output signal PH1·WED of logic gate 70. Thus, the two kinds of data are held in latch circuits 22 and 24.

Furthermore, in the synchronous SRAM in FIG. 8, a multiplexer 33 and a logic gate 72 are additionally provided. Multiplexer 33 receives data WD1 output from latch circuit 24, data WD2 output from latch circuit 22 and the output signals of logic gates 66 and 71.

Multiplexer 33 applies data WD1 to multiplexer 32 if the output signal of logic gate 66 is in H level, while applies data WD2 to multiplexer 32 if the output signal of logic gate 71 is in H level.

Thus, unlike that in FIG. 3, multiplexer 32 receives one of the input data from multiplexer 33. Logic gate 72 receives the output signals of logic gates 66 and 71. Logic gate 72 is an OR gate, and pulls its output signal to H level when one or both of two input signals are in H level. The output signal of logic gate 72 is applied to multiplexer 32 as a control signal.

Multiplexer 32 outputs read data RD from read circuit 53 when the control signal applied from logic gate 72 is in L level, and outputs data WD1 or WD2 applied from multiplexer 33 when the control signal is in H level.

An operation of the synchronous SRAM shown in FIG. 8 will be described. Herein, part of the operation different from the synchronous SRAM in FIG. 3 will be mainly described.

Now, an operation of holding an address signal will be described. Latch circuit 13 takes in an address signal output from latch circuit 11 in the first phase of a cycle for a writing operation. The taken address signal is an address signal for writing data into memory cell array 51, and the signal is passed through latch circuit 14 and applied to latch circuits 25 and 15 in the second phase.

In the first phase of the following cycle, latch circuit 15 takes in the address signal output from latch circuit 14, and applies the signal as an internal address signal W2ADD to comparator 41.

Then, in the first phase of the cycle of the next writing operation, latch circuit 25 takes in the address signal output from latch circuit 15. At the time, latch circuit 13 takes in a new address signal as is the case with the above-described operation.

Thus, two addresses are held as internal address signals W1ADD and W2ADD.

An operation of holding data will be described. Data corresponding to the address signal taken into latch circuit 13 in the first cycle of the above writing operation is taken into latch circuit 22 when signal PH1·WE attains H level in the first phase of the next cycle. The taken data is output toward latch circuit 23 and multiplexer 33 as data WD2. Data output from latch circuit 22 is applied to latch circuit 24 through latch circuit 23 in the second phase Ph2 of the cycle.

In the second cycle of the next writing operation, the output of latch circuit 23 is taken into latch circuit 24, and applied to write circuit 54 and multiplexer 33 as data WD1.

At the time, data WD2 is updated to data newly taken into latch circuit 22 in the same operation as the above-described case.

Addresses and data held through such operations of holding address signals and data are taken into decoder 52 and write circuit 54 when internal write enable signal NWEin is in L level. Then, data is written into memory cell array 51 based on these addresses and data.

Then, how to cope with a request of reading data which is held by such holding operation and has not yet been written in the memory cell array 51 will be described. In such a case, internal address signal RADD designated for reading and one of held internal address signals W1ADD and W2ADD coincide with each other. In response to the coincidence, the output signal of one of logic gates 66 and 71 attains H level.

In response, data WD1 or WD2 from multiplexer 33 is applied to multiplexer 32, and the data is output from multiplexer 32 in response to a control signal from logic gate 72. More specifically, one of the held data is externally output bypassing memory cell array 51.

As described above, in the synchronous SRAM in FIG. 8, the operations shown in FIG. 7 can be implemented. Accordingly, as is the case with the synchronous SRAM in FIG. 3, a conflict of resources does not occur. Similarly, data can be smoothly read out even if reading of data which has not yet been written is requested.

Furthermore, what is characteristic of the synchronous SRAM in FIG. 8 is that since resource DIN and resource RAN are not used in the same cycle, rooms in timings for data transfer and writing in a writing operation can be increased.

As in the foregoing, the following effects are brought about according to Second Embodiment. Since data to be written into the memory cell array is taken in when data read out from a memory cell is not being externally output, a conflict of resources at the portion related to external output can be prevented.

Furthermore, since data to be written in the memory cell array and internal address signals are held in a prescribed order, the period to use a memory cell for writing held data can be prolonged through the period in which the memory cell is not used generated at the following data writing depending upon the amount of held data. As a result, a conflict of resources can be avoided in the memory cell array. In addition, rooms can be secured for timings for taking in data and use of the memory cell array.

Furthermore, if held data which has not yet been written should be read out, a disadvantage at the time of reading associated with such data holding is not encountered.

Thus, a conflict of resources can be prevented, delay of a writing operation following a reading operation can be eliminated without increasing chip cost, package cost and system cost. As a result, high speed operation of cache memories can be achieved, and the speed performance of computers of various levels such as supercomputer, large size calculator, work station and personal computer can be improved.

Note that in the foregoing description of the embodiments, the invention is applied to synchronous SRAMs, but the invention is not limited to such applications and is also applicable to other random access memories which are directly connected to processors and produce an internal address in response to an external address. The invention has therefore applicability to dynamic random access memories.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device comprising:
    a memory cell array including a plurality of memory cells;
    a decoder for selecting a memory cell in said memory cell array;
    an input buffer for receiving write data;
    a write register for receiving write data from said input buffer, latching received write data in response to a write enable signal designating a write operation in a first cycle, and holding received write data until said write enable signal designates the write operation in a second cycle subsequent to said first cycle; and
    a write control circuit for writing write data held by said write register in the memory cell selected by said decoder in response to said write enable signal designating the write operation in said second cycle.

2. The semiconductor memory device according to claim 1, wherein
    said semiconductor memory device is a synchronous static random access memory.

3. The semiconductor memory device according to claim 1, wherein
    said write register latches newly received write data in response to said write enable signal designating the write operation in said second cycle.

4. The semiconductor memory device according to claim 1, further comprising:
    a read register for receiving read data from the memory cell selected by said decoder, and latching received read data; and
    an output buffer for outputting read data latched by said read register.

5. The semiconductor memory device according to claim 1, wherein
    said write register continuously holds write data during a third cycle in which read data is read from the memory cell selected by said decoder when said third cycle is between said first and second cycles.

6. The semiconductor memory device according to claim 1, further comprising:
    an address register for holding an address signal corresponding to write data held by said write register;
    a comparator for comparing newly inputted address signal and said address signal held by said address register; and
    an output circuit for selectively outputting one of write data held by said write register and data read from the memory cell selected by said decoder in response to a comparing result by said comparator.

7. The semiconductor memory device according to claim 1, wherein
    said write register latches the write data associated with an address applied in the first cycle a predetermined number of cycles later.

8. The semiconductor memory device according to claim 7, wherein the predetermined number is two.

9. The semiconductor memory device according to claim 1, wherein
    the write data associated with an address applied in the first cycle is required a predetermined number of cycles later.

10. The semiconductor memory device according to claim 9, wherein the predetermined number is two.

* * * * *

UNITED STATES PATENT AND TRADEMARK OFFICE
CERTIFICATE OF CORRECTION

Page 1 of 4

PATENT NO. : 6,026,048
DATED : February 15, 2000
INVENTOR(S) : TOMOHISA WADA

It is certified that error appears in the above-identified patent and that said Letter Patent is hereby corrected as shown below:

Column 10, line 5, change "Fig. 5 is a timing chart" to --Figs. 5A-5H are timing charts--.

Column 10, line 8, change "Fig. 6 is a timing chart" to --Figs. 6A-6J are timing charts--.

Figure 11:
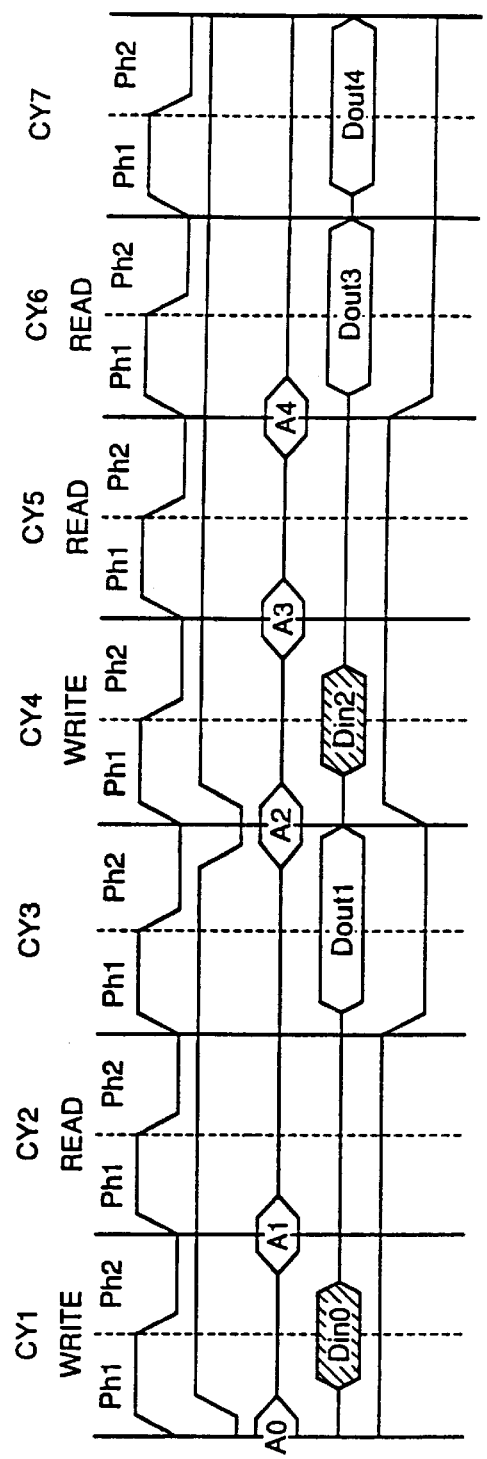
FIG. 11 is a timing chart for use in illustration of the operation of the synchronous SRAM in FIG. 10.

Column 10, line 20, change "Fig. 11 is a timing chart" to --Figs. 11A-11E are timing charts--.

Column 17, line 30, change "RAN" to --RAM--.

Column 18, line 58 (Claim 7, line 5), after "of" insert --one or more--.

Column 18, line 64 (Claim 9, line 4), after "of" insert --one or more--.

Column 18, after line 67 (after Claim 10), insert the following claims 11-20:

-- 11. A semiconductor memory device comprising:
an address input circuit for receiving an address signal designating a first address in a first cycle;
a write enable input circuit for receiving a write enable signal designating a write operation in the first cycle;
a data input circuit for receiving a write data associated with the address signal in the first cycle a predetermined number of one or more cycles later, and holding the received write data;
a memory cell array;
a write circuit for writing the write data held by said data input circuit in said memory cell array; and
a data steering circuit for selecting the write data held by said data input circuit as a read data when a read operation with the first address is required.

UNITED STATES PATENT AND TRADEMARK OFFICE
CERTIFICATE OF CORRECTION

PATENT NO. : 6,026,048
DATED : February 15, 2000
INVENTOR(S) : TOMOHISA WADA

It is certified that error appears in the above-identified patent and that said Letter Patent is hereby corrected as shown below:

12. The semiconductor memory device according to claim 11, wherein the predetermined number is two.

13. The semiconductor memory device according to claim 11, further comprising:
a write address register for holding the address signal associated with the write data held by said data input circuit; and
a control circuit for comparing a newly inputted address signal and the address signal held by said write address register, wherein
said data steering circuit is operative to select the write data held by said data input circuit in response to a comparison result by said control circuit.

14. A semiconductor memory device comprising:
a memory cell array including a plurality of memory cells;
a decoder for selecting a memory cell in said memory cell array;
an input buffer for receiving write data;
a write register for receiving write data from said input buffer, latching received write data in response to a write enable signal designating a write operation in a first cycle, and holding received write data until said write enable signal designates the write operation in a second cycle subsequent to said first cycle with a predetermined number of write operations inserted between said first and second cycles; and
a write control circuit for writing write data held by said write register in the memory cell selected by said decoder in response to said write enable signal designating the write operation in said second cycle.

15. The semiconductor memory device according to claim 14, wherein the predetermined number is zero, so that the write operation designated in said second cycle is a first write operation after the write operation designated in said first cycle.

16. The semiconductor memory device according to claim 14, wherein the predetermined number is one, so that the write operation designated in said second cycle is a second write operation after the write operation designated in said first cycle.

UNITED STATES PATENT AND TRADEMARK OFFICE
CERTIFICATE OF CORRECTION

PATENT NO. : 6,026,048
DATED : February 15, 2000
INVENTOR(S) : TOMOHISA WADA

It is certified that error appears in the above-identified patent and that said Letter Patent is hereby corrected as shown below:

17. A semiconductor memory device comprising:
an address input circuit for receiving an address signal designating a write address;
a data input circuit for receiving a write data associated with the write address at least one cycle later, and holding the received write data;
a memory cell array in which the write data held by said data input circuit is written; and
a multiplexer for selecting, as a read data, one of the write data held by said data input circuit and data read from said memory cell array.

18. The semiconductor memory device according to claim 17, further comprising:
a write address register circuit for holding the address signal associated with the write data held by said data input circuit; and
a control circuit for comparing newly inputted address signal and the address signal held by said write address register circuit, wherein
said multiplexer selects the write data held by said data input circuit in response to a comparison result by said control circuit.

19. The semiconductor memory device according to claim 18, wherein
said data input circuit includes at least one write data register, and
said write address register circuit includes at least one write address register corresponding to said at least one write data register.

20. The semiconductor memory device according to claim 18, wherein
said data input circuit includes two write data registers,
said write address register circuit includes two write address registers corresponding to said two write data registers respectively,

UNITED STATES PATENT AND TRADEMARK OFFICE
CERTIFICATE OF CORRECTION

PATENT NO. : 6,026,048
DATED : February 15, 2000
INVENTOR(S) : TOMOHISA WADA

It is certified that error appears in the above-identified patent and that said Letters Patent is hereby corrected as shown below:

said control circuit compares newly inputted address signal and each of the address signals held by said write address registers, and
said multiplexer selects the write data held by one of said write data registers in response to the comparison result by said control circuit.--

Signed and Sealed this

Twenty-ninth Day of May, 2001

Attest:

NICHOLAS P. GODICI

*Attesting Officer*   Acting Director of the United States Patent and Trademark Office